(12) United States Patent
Delson

(10) Patent No.: US 7,176,724 B1
(45) Date of Patent: Feb. 13, 2007

(54) HIGH SPEED CHIP-TO-CHIP COMMUNICATION LINKS

(75) Inventor: Kenneth A. Delson, Severn, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 54 days.

(21) Appl. No.: 11/063,886

(22) Filed: Feb. 24, 2005

(51) Int. Cl.
*H03K 19/0175* (2006.01)

(52) U.S. Cl. .............................. 326/83; 326/63; 326/27

(58) Field of Classification Search .................. 326/26, 326/27, 63, 68, 82–86
See application file for complete search history.

(56) References Cited

U.S. PATENT DOCUMENTS

| | | | |
|---|---|---|---|
| 5,491,441 A * | 2/1996 | Goetschel et al. | 327/291 |
| 6,937,664 B1 * | 8/2005 | Park et al. | 375/259 |
| 2003/0193350 A1 * | 10/2003 | Chow | 326/83 |
| 2006/0061405 A1 * | 3/2006 | Zerbe | 327/336 |

* cited by examiner

*Primary Examiner*—Don Le
(74) *Attorney, Agent, or Firm*—Rothwell, Figg, Ernst & Manbeck, P.C.

(57) ABSTRACT

A very low voltage swing is used to achieve very high data rates (up to 4 Gbps double data rate) at very low power consumption. A differential signaling approach is used for noise rejection, and a constant current approach also is used to minimize switching noise.

12 Claims, 4 Drawing Sheets

Modified differential voltage swing and common mode.

HIGH SPEED CHIP-TO-CHIP COMMUNICATION LINKS

GOVERNMENT LICENSE RIGHTS

The United States Government may have certain rights in some aspects of the invention claimed herein, as the invention was made with United States Government support under award/contract number NBCHC010038 for the Department of Interior/National Business Center.

BACKGROUND OF THE INVENTION

1. Field of the Invention

The present invention is directed to communications between and transfer of signals between integrated circuit chips, interconnections between such chips and methods of connecting integrated circuit chips for high speed communications therebetween.

2. Description of the Related Art

The coupling of signals between integrated circuit chips, either on the same circuit board or between boards, is of critical interest. Metal interconnections (i.e., metal backplanes) appear to have reached their speed limits, which are estimated to be in the 100s of Giga-bits-per second (Gbps), for each backplane. Discrete channel fiber-optical connections are being incorporated on top of the metal interconnections, but they too are limited to approximately 10 Gbps per channel.

The LVDS standard (Low Voltage Differential Signaling) is currently a popular standard and is based on differential data transmission. This popularity is mainly driven by the ability of LVDS to deliver high speed transmission without large power consumption. LVDS is a differential scheme, which uses two signal lines (traces or conductors) to convey information, with increased noise tolerance in the form of common-mode rejection being achieved. Because of the improvement in signal-to-noise rejection, the signal swing could be dropped to only a few hundred millivolts. Specifications for the LVDS standard may be found in ANSI/TIA/EIA-644-1995 Electrical characteristics standard titled: "Electrical Characteristics of Low Voltage Differential Signaling (LVDS) Interface Circuits."

In addition, LVDS offers other benefits that include low voltage power supply compatibility, low noise generation, high noise rejection, robust transmission signals, and integration. For these reasons, it has been deployed across market segments wherever the need for speed exists. Even with all these benefits, there are some limitations in certain applications, including support of multipoint bus configurations, operation from still lower power rail voltage, and extended receiver common-mode range.

Of particular interest and need is the ability to increase transmission power efficiency in terms of data transmission speed per unit of power.

SUMMARY OF THE INVENTION

The present invention solves this need by providing a new design for low power, high speed chip-to-chip communication (either on the same circuit board or between boards on a common backplane).

According to the present invention, a very low voltage swing is used to achieve very high data rates (up to 4 Gbps double data rate) at very low power consumption. A differential signaling approach is used for noise rejection, and a constant current approach also is used to minimize switching noise.

The invention provides according to one preferred embodiment a complete link for high speed, low power chip-to-chip communication, including driver and receiver configurations.

According to an embodiment of the present invention, the differential swing and common mode are decreased so as to effectively increase the data speed and lower the power usage of integrated circuit chip I/O cells. To accomplish this, according to one exemplary embodiment of the invention novel designs of amplifier, inverter, ESD (electrostatic discharge) protection, current mirror, and current driver components are provided to achieve the desired data transfer speed and power consumption goals.

In particular, according to one aspect of the invention, an input/output interface circuit for transferring data between integrated circuit chips is provided, which includes a driver circuit including an inverter stage and a constant current driving stage, that receives an input data signal and develops a differential voltage signal corresponding thereto, a receiver circuit that receives the differential voltage signal from the driver circuit, including a differential in/differential out amplifier stage that receives the differential voltage signal and outputs an amplified differential signal, a differential in/single-ended out amplifier stage that receives said amplified differential signal and outputs a voltage swing signal, and an inverter stage for increasing drive strength of said voltage swing signal for transfer into a chip core.

According to a second aspect of the invention, a method of providing low power, high speed data transfer between integrated circuit chips is provided, including the steps of converting data output from an integrated circuit chip to a differential voltage signal having a common mode range of 1 V, and a voltage swing of 100 mV, converting the differential voltage signal to a constant current driving signal and applying said constant current driving signal to a differential receiver circuit.

DETAILED DESCRIPTION OF PREFERRED EMBODIMENTS

Figure 1:
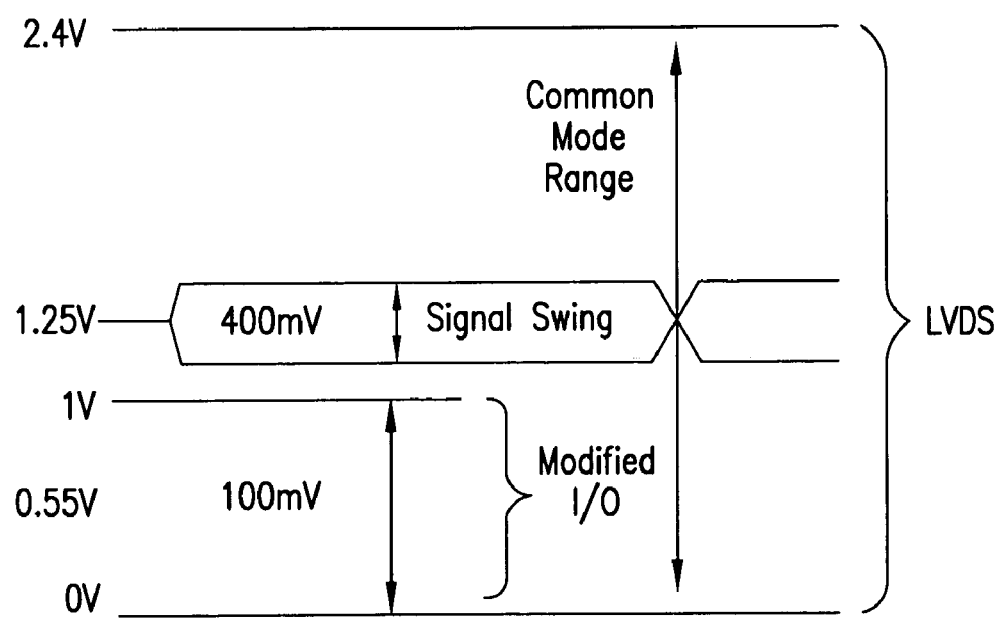
FIG. 1 is a chart showing a modified differential voltage swing and common mode range according to one preferred embodiment of the invention.

FIG. 1 illustrates the difference between a conventional LVDS signaling standard and the modified design according to one preferred embodiment of the invention. As shown, according to a conventional LVDS standard, a common mode voltage range of 2.4 V, and a differential signal swing of 400 mV at 1.25 V are used. According to one embodiment of the present invention, a modified common mode range of 1 V is used, along with a differential signal swing of 100 mV at 0.55 V. In order to realize the use of such modified levels, new designs of circuit components for both a receiver and driver circuit are provided.

Figure 2:
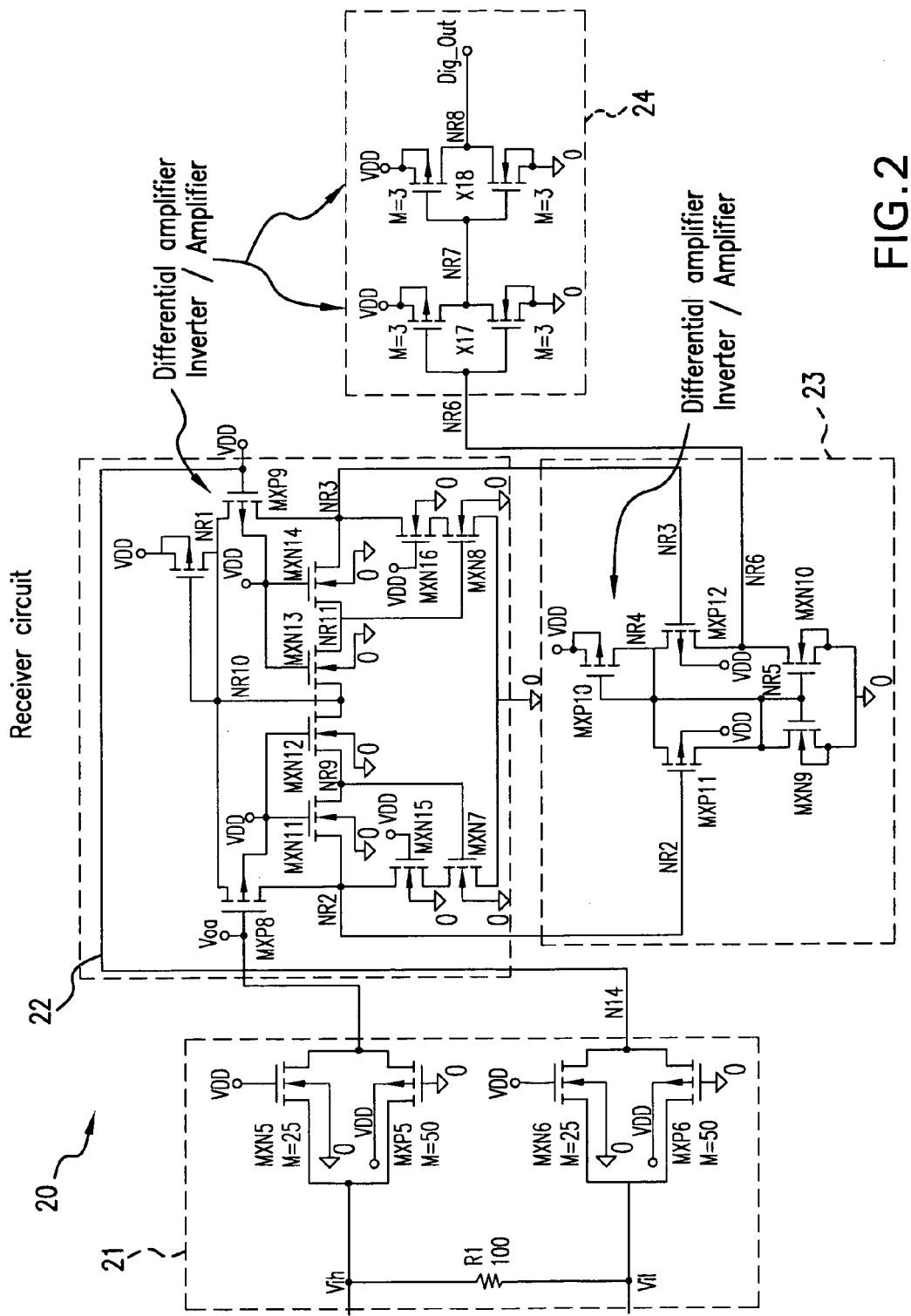
FIG. 2 is a circuit diagram of a receiver interface according to one preferred embodiment of the present invention.

Referring to FIG. 2, one preferred embodiment of a receiver circuit 20 according to the present invention is disclosed. A first stage of the receiver circuit is an ESD protection stage 21, including a pair of modified transmission gates, a first of which receives a high differential voltage input Vih, and a second of which receives a low differential voltage input Vil, across a resistor R1. A second stage of the receiver is a differential in/differential amplifier stage 22. Transistor matching was used to increase the circuit's sensitivity to small differential signals. A first input MXP8 of stage 22 receives the high differential voltage Vih from ESD protection stage 21, and a second input MXP9 of stage 22 receives the low differential voltage Vil from ESD protection stage 21. Differential voltage signal are outputted at nodes NR2 and NR3.

A third stage of the receiver circuit is a differential in/single-ended out amplifier stage 23. This stage receives differential voltage inputs at gates MXP11 and MXP12, and outputs a single voltage signal at output node NR6. The output voltage signal from amplifier stage 23 is a weak, large swing (i.e. nearly rail-to-rail) signal.

The final stage of the receiver circuit 20 is an inverter series stage 24, which includes a number of inverters arranged in series to increase the drive strength of the receiver into the core of a chip. While only two inverters are shown in the example of FIG. 2, it will be recognized by those of skill in the art that a greater or lesser number of inverters also may be used in accordance with specific application/chip design considerations. The inverter stage receives the single voltage output signal from amplifier stage 23 at input X17, and outputs a final output voltage signal Dig_Out at output node NR8.

Figure 3:
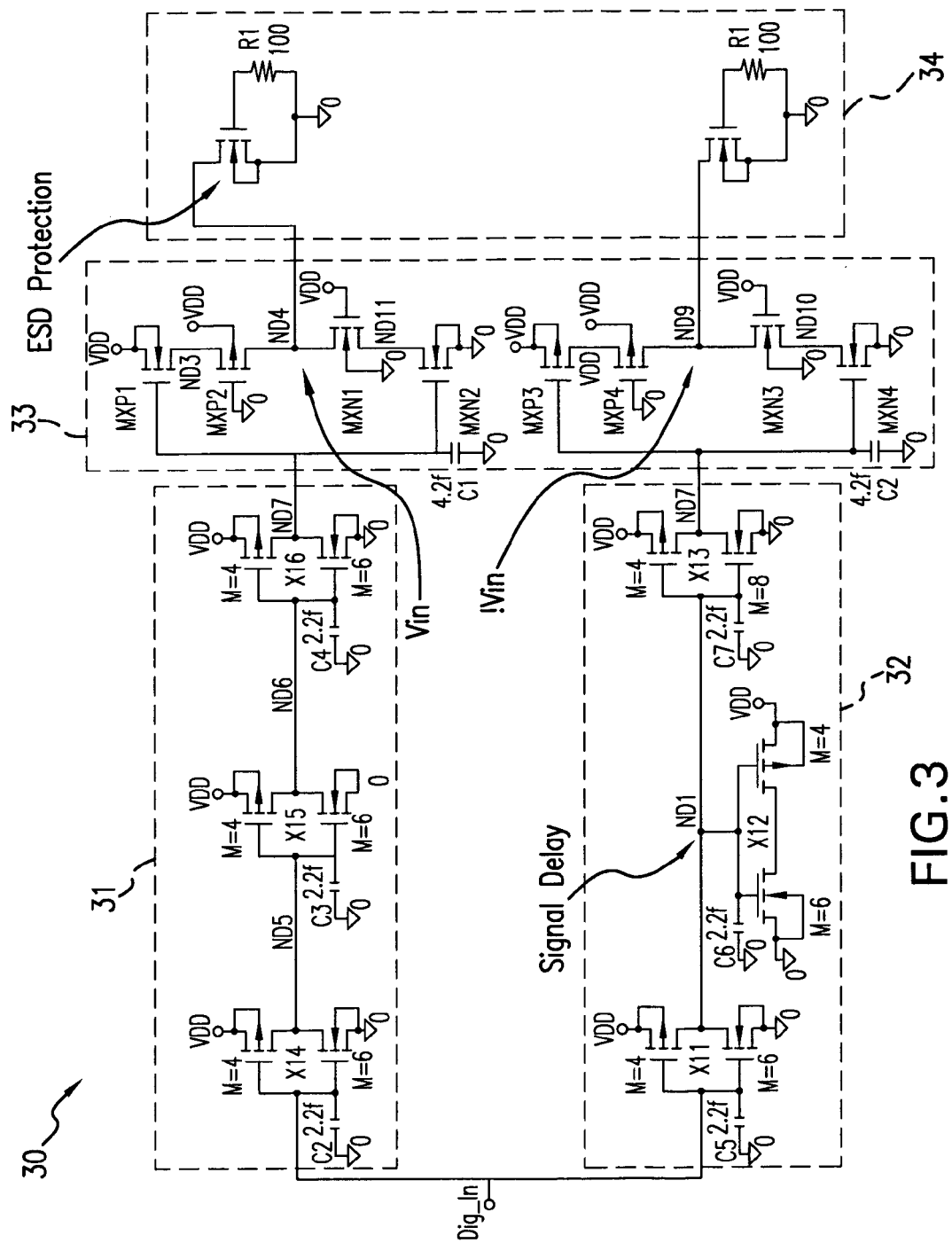
FIG. 3 is a circuit diagram of a driver interface according to one preferred embodiment of the present invention.

Referring now to FIG. 3, an exemplary embodiment of a driver circuit 30 according to the present invention is described. The driver circuit is composed of three main stages. The first stage is an inverter stage comprised of two groups 31, 32 of three inverters each. One of the inverters of group 32 is used as a signal delay to compensate for the propagation time required for the data signal to transition to the next state. The inverter stage 31, 32 receives an input signal Dig_In, processes the signal and provides the signal at each of nodes ND2 and ND7.

The next stage is a current driving stage 33. The current driving stage 33 provides driver differential voltage signals Vin and !Vin at nodes ND4 and ND9. The final stage is an ESD protection stage 34 formed of modified transmission gates. The ESD protection stage receives the differential voltage signals and passes them through to a receiver. There are two areas of ESD protection in the driver circuit 30. In addition to the ESD stage 34, the transistors on either side of nodes ND4 and ND9 provide increased ESD protection. The main purpose of these transistors is to modify the DC offset of the output differential signal from the driver.

Figure 4:
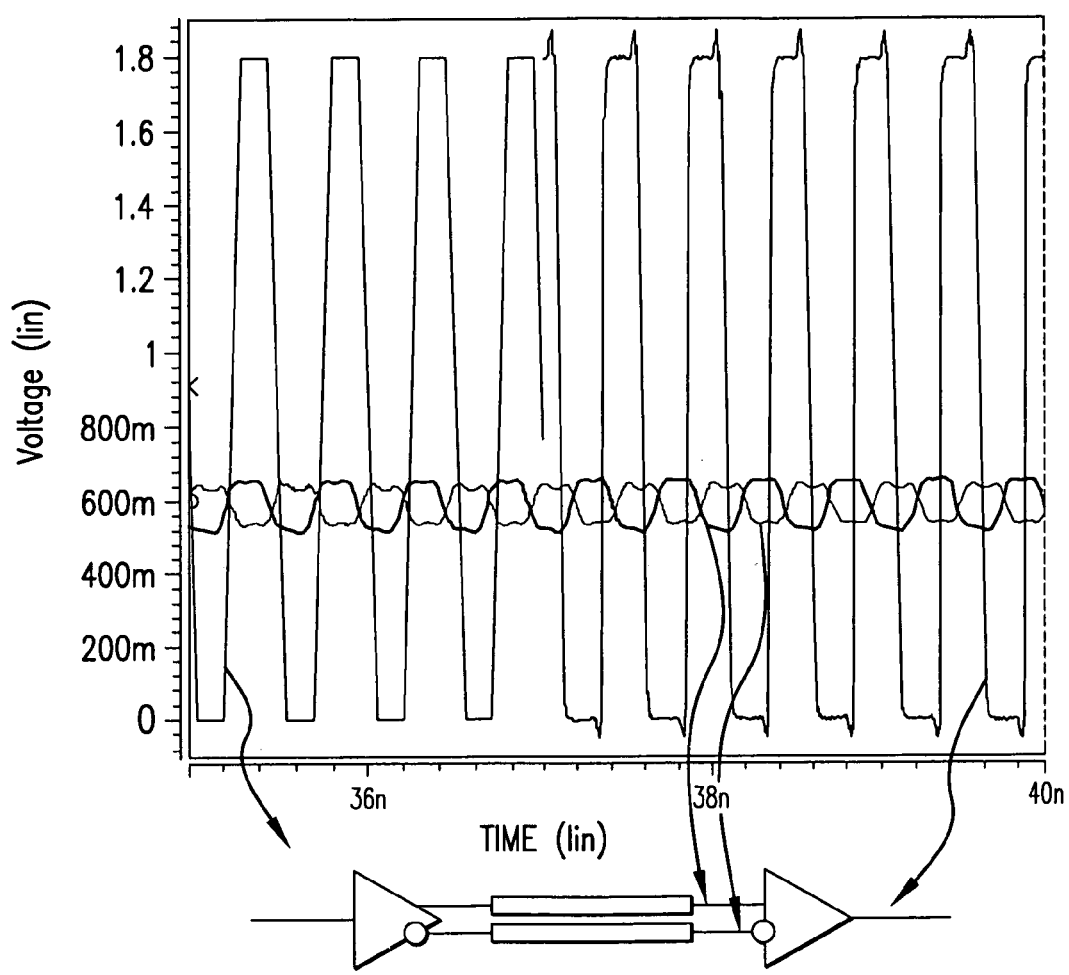
FIG. 4 is a chart showing input waveform vs. output waveform for the circuit designs of FIGS. 2 and 3.

FIG. 4 is a chart showing input v. output waveforms for the I/O transfer circuit. The input signal to the driver, which typically is from the core of a chip, is indicated by the wave having an arrow pointing to the driver input at the bottom of the figure. The output waveform of the receiver is indicated by the wave having an arrow pointing to the receiver output at the bottom of the figure. The 100 mV differential signal, with a DC offset of approximately 600 mV, is indicated by the arrows pointing to the input of the receiver at the bottom of the figure.

Table 1 below shows the relationship between input signal frequency and average power consumed. As shown, the power requirements of the circuit increase as the frequency (i.e., speed) of the input signal increases. As seen, the circuit exhibits a non-linear increase in efficiency as frequency increases. When the clock rate of the input signal is more than doubled from 0.6 GHz to 2 GHz, the average power increases only slightly, at less than 50%. The Data Rate Per Unit Power column shows the number of bits per second transmitted for each watt of power used. The final column shows the improvement factor of the present invention over existing LVDS designs.

TABLE 1

Simulated I/O power at various speeds.

| | Average Power (mW) | Clock Rate (GHz) | Data Rate @DDR (Gbps) | Data Rate Per Unit Power @DDR (Gbps/W) | Improvement Over Existing Cell |
| --- | --- | --- | --- | --- | --- |
| Existing LVDS (0.18) | 46.5 | 0.6 | 1.2 | 26 | 1 |
| MSP cell (0.18) | 11.5 | 0.6 | 1.2 | 104 | 4 |
| MSP cell (0.18) | 12.3 | 1 | 2 | 162 | 6 |
| MSP cell (0.18) | 13.3 | 1.5 | 3 | 216 | 9 |
| MSP cell (0.18) | 14.2 | 2 | 4 | 282 | 11 |

Table 2 shows simulated I/O power at 2 GHz over three simulated cases of voltage and temperature ranges. In the worst-case conditions, the temperature is high (125 C) and the voltage is low (−10% of normal level), and the transistors do not respond well to stimuli. For the nominal case, all of the parameters remain at normal operating conditions. Finally, in the best case conditions the temperature is low (−55 C), the voltage is high (+105 of normal level), and the transistors respond better than average to stimulus. The simulated average power is lowest for worst-case conditions and increases as conditions improve. The first row results were obtained before the simulated circuit layout was implemented. The second row was collected after insertion of the driver. The extracted driver included metal capacitance and diodes. The last row shows the power required for a design implementing LVDS in 0.25 um technology.

TABLE 2

Simulated I/O power at 2 GHz over voltage and temperature ranges

| | Worst Case T = 125° C. | | | | Nominal Case T = 25° C. | | | | Best T = −55° C. | | | |
|---|---|---|---|---|---|---|---|---|---|---|---|---|
| | V −10% = 1.62 V<br>Io = −4.1 mA<br>Diffo = 100 mV | | V −5% = 1.7 V<br>Io = −4.8 mA<br>Diffo = 120 mV | | V −5% = 1.7 V<br>Io = −6.5 mA<br>Diffo = 180 mV | | V = 1.8 V<br>Io = −7.6 mA<br>Diffo = 200 mV | | V +5% = 1.89 V<br>Io = −12.1 mA<br>Diffo = 350 mV | | V +10% = 1.98 V<br>Io = −13.6 mA<br>Diffo = 375 mV | |
| | Ones (mW) | Clk (mW) | Ones (mW) | Clk (mW) | Ones (mW) | Clk (mW) | Ones (mW) | Clk (mW) | Ones (mW) | Clk (mW) | Ones (mW) | Clk (mW) |
| Latest Design @ 2 GHz | 5.69 | 7.17 | 6.81 | 8.52 | 9.12 | 11.02 | 11.17 | 13.34 | 18.34 | 21.43 | 21.78 | 25.29 |
| Driver Extract @ 2 GHz | 5.28 | 7.03 | 6.47 | 8.27 | 8.51 | 10.49 | 10.43 | 12.67 | 17.39 | 19.73 | 20.40 | 23.19 |
| Atmel Driver @ 600 MHz | 25.00 | | | | 45.00 | | | | 70.00 | | | |

The invention having been fully described above with reference to the drawing figures, it will be apparent to those of skill in the art that certain modifications, variations, and alternative constructions are possible, while remaining within the spirit and scope of the invention.

What is claimed is:

1. An input/output interface circuit for transferring data between integrated circuit chips, comprising:
    a driver circuit including an inverter stage and a constant current driving stage, that receives an input data signal and develops a differential voltage signal corresponding thereto;
    a receiver circuit that receives the differential voltage signal from the driver circuit, including a differential in/differential out amplifier stage that receives the differential voltage signal and outputs an amplified differential signal, a differential in/single-ended out amplifier stage that receives said amplified differential signal and outputs a voltage swing signal, and an inverter stage for increasing drive strength of said voltage swing signal for transfer into a chip core.

2. The circuit of claim 1, wherein said driver circuit further includes an ESD protection stage that transfers the differential voltage signal from said current driving stage to said receiver circuit.

3. The circuit of claim 1, wherein said driver circuit inverter stage is divided into two groups of inverters, with an inverter of one of said groups functioning as a delay to compensate for signal transition time.

4. The circuit of claim 3, wherein each group of inverters comprises at least two inverters.

5. The circuit of claim 3, wherein each group of inverters comprises at least three inverters.

6. The circuit of claim 1, wherein said receiver circuit further includes an ESD protection stage that transfers the differential voltage signal from said driver circuit to said differential in/differential out amplifier stage.

7. The circuit of claim 1, wherein said receiver circuit inverter stage includes at least two inverters arranged in a series configuration.

8. The circuit of claim 1, wherein said circuit utilizes a common mode range of 1V.

9. The circuit of claim 1, wherein said circuit utilizes a signal voltage swing of 100 mV.

10. The circuit of claim 9, wherein said voltage swing signal is centered on 0.55 V.

11. A method of providing low power, high speed data transfer between integrated circuit chips, comprising the steps of:
    converting data output from an integrated circuit chip a differential voltage signal having a common mode range of 1 V, and a voltage swing of 100 mV;
    converting said differential voltage signal to a constant current driving signal; and
    applying said constant current driving signal to a differential receiver circuit.

12. The method of claim 11, wherein said voltage swing is centered on 0.55 V.

* * * * *